United States Patent
Song et al.

(10) Patent No.: US 11,353,937 B2
(45) Date of Patent: Jun. 7, 2022

(54) SERVER CHASSIS AND FASTENING ASSEMBLY THEREOF

(71) Applicants: INVENTEC (PUDONG) TECHNOLOGY CORPORATION, Shanghai (CN); INVENTEC CORPORATION, Taipei (TW)

(72) Inventors: Er-Zhen Song, Shanghai (CN); Xiaogang Lu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/153,759

(22) Filed: Jan. 20, 2021

(65) Prior Publication Data
US 2021/0373617 A1    Dec. 2, 2021

(30) Foreign Application Priority Data
May 29, 2020    (CN) .......................... 202010482048.6

(51) Int. Cl.
*G06F 1/18*          (2006.01)

(52) U.S. Cl.
CPC .............. *G06F 1/185* (2013.01); *G06F 1/186* (2013.01)

(58) Field of Classification Search
CPC ................................ G06F 1/185; G06F 1/186
See application file for complete search history.

(56) References Cited

U.S. PATENT DOCUMENTS

| | | | |
|---|---|---|---|
| 5,967,824 A * | 10/1999 | Neal ....................... | G06F 1/184 439/157 |
| 11,079,814 B2 * | 8/2021 | Chen ....................... | G06F 1/186 |

* cited by examiner

*Primary Examiner* — James Wu
(74) *Attorney, Agent, or Firm* — Maschoff Brennan

(57) ABSTRACT

A server chassis, configured to detachably fasten a PCB, includes a case, an expansion frame, and a fastening assembly. The fastening assembly includes a slidable component, a guiding component disposed through the slidable component and fixed to the case, a movable pin movably disposed through the slidable component, and a fastening pin fixed to the slidable component. When the slidable component is at a fastening position, the movable pin is movable between inserted and extracted positions. When the movable pin is at the inserted position, the movable pin is disposed through the slidable component and the case, such that the slidable component is positioned at the fastening position, and the fastening pin is disposed through the PCB and the expansion frame. When the movable pin is at the extracted position, the movable pin is disengaged from the case, such that the slidable component is slidable to a releasing position.

10 Claims, 6 Drawing Sheets

SERVER CHASSIS AND FASTENING ASSEMBLY THEREOF

CROSS-REFERENCE TO RELATED APPLICATIONS

This non-provisional application claims priority under 35 U.S.C. § 119(a) on Patent Application No(s). CN, 202010482048.6 filed in China on May 29, 2020, the entire contents of which are hereby incorporated by reference.

TECHNICAL FIELD

This disclosure relates to a server chassis and a fastening assembly thereof, more particularly to a server chassis and a fastening assembly capable of easily installing and removing a printed circuit board from a case.

BACKGROUND

With the growth of the Internet, various technologies and devices related to network servers are accordingly developed. In addition, the structural improvement of the server chassis is also a development project highly valued currently.

In order to effectively utilizing the space in the server chassis, manufacturers are devoted to optimizing the space arrangement of modules in the server. Generally, the modules are compactly installed in the server chassis so as to accommodate as many required modules as possible. Usually, components in the server are mostly fastened by screws. However, when the components need to be removed from the server for maintenance or replacement and then be installed therein, it is difficult to screw or unscrew the screws in the corners with external tools (e.g., screw drivers) due to space constraints. Further, the unscrewed screws may be missing during maintenances, and it can be troublesome for maintenance staff or assemblers.

SUMMARY

The present disclosure is to provide a server chassis and a fastening assembly capable of eliminating the inconvenience of screwing or unscrewing screws in the corners and avoiding problems of missing screws.

One embodiment of the disclosure provides a server chassis configured to detachably fasten a printed circuit board. The server chassis includes a case, an expansion frame, and a fastening assembly. The case has a through hole. The expansion frame is fixed to the case, and the expansion frame has an engagement hole. The fastening assembly includes a slidable component, at least one guiding component, a movable pin, and a fastening pin. The slidable component has a guiding hole. The at least one guiding component is disposed through the guiding hole and fixed to the case, such that the slidable component is slidable relative to the at least one guiding component between a releasing position and a fastening position. The movable pin is movably disposed through the slidable component. When the slidable component is located at the fastening position, the movable pin is movable between an inserted position and an extracted position. The fastening pin is fixed to the slidable component. When the movable pin is located at the inserted position, the movable pin is disposed through the slidable component and the through hole of the case, such that the slidable component is positioned at the fastening position, and the fastening pin passes through a penetrating hole of the printed circuit board and the engagement hole of the expansion frame. When the movable pin is located at the extracted position, the movable pin is disengaged from the through hole of the case, such that the slidable component is able to slide between the releasing position and the fastening position, and the fastening pin is movable along with the slidable component with respect to the expansion frame.

One embodiment of the disclosure provides a fastening assembly configured to be disposed on a case of a server chassis and configured to detachably fasten a printed circuit board to the case. The fastening assembly includes a slidable component, at least one guiding component, a movable pin, and a fastening pin. The slidable component has a guiding hole. The at least one guiding component is disposed through the guiding hole and configured to be fixed to the case, such that the slidable component is slidable relative to the at least one guiding component between a releasing position and a fastening position. The movable pin is movably disposed through the slidable component. When the slidable component is located at the fastening position, the movable pin is movable between an inserted position and an extracted position. The fastening pin is fixed to the slidable component. When the movable pin is located at the inserted position, the movable pin is disposed through the slidable component and configured to be disposed through a through hole of the case, such that the slidable component is positioned at the fastening position, and the fastening pin is configured to be disposed through the printed circuit board and the case. When the movable pin is located at the extracted position, the movable pin is disengaged from the through hole of the case, such that the slidable component is able to slide between the releasing position and the fastening position, and the fastening pin is movable along with the slidable component with respect to the printed circuit board.

According to the foolproof frame assembly and the server chassis as described above, the fastening assembly is configured to engage with the penetrating hole of the printed circuit board closest to the case and disposed through the engagement hole of the expansion frame. As such, when the printed circuit board is to be removed from the expansion frame, the fastening pin on the slidable component can be easily removed from the penetrating hole of the printed circuit board and the engagement hole of the expansion frame by moving the slidable component away from the penetrating hole. It eliminates the inconvenience of unscrewing the screws in the corners using screw drivers, and avoids problems of missing screws.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
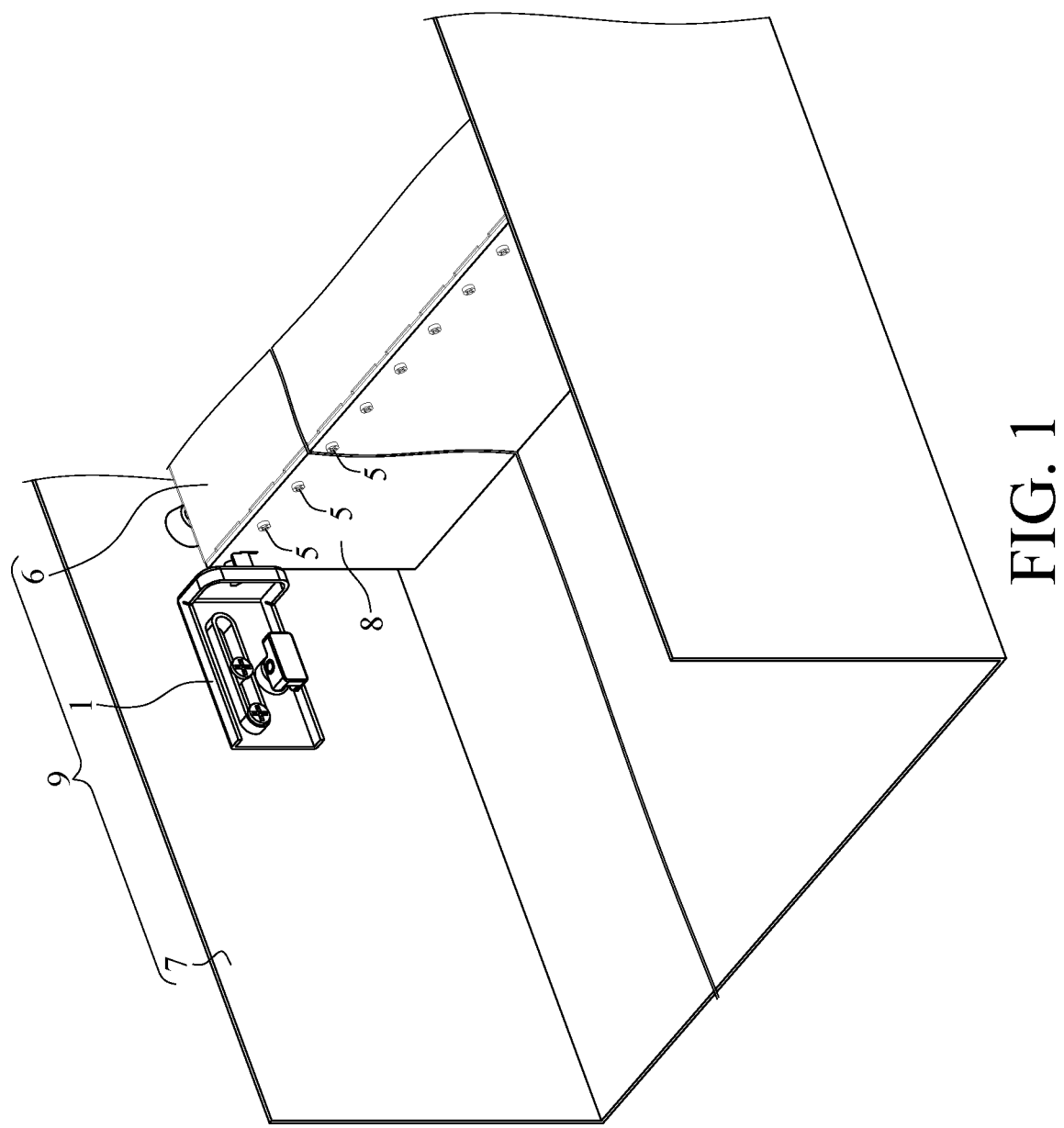
FIG. 1 is a perspective view of a server chassis and a printed circuit board in accordance with one embodiment of the disclosure.
Figure 2:
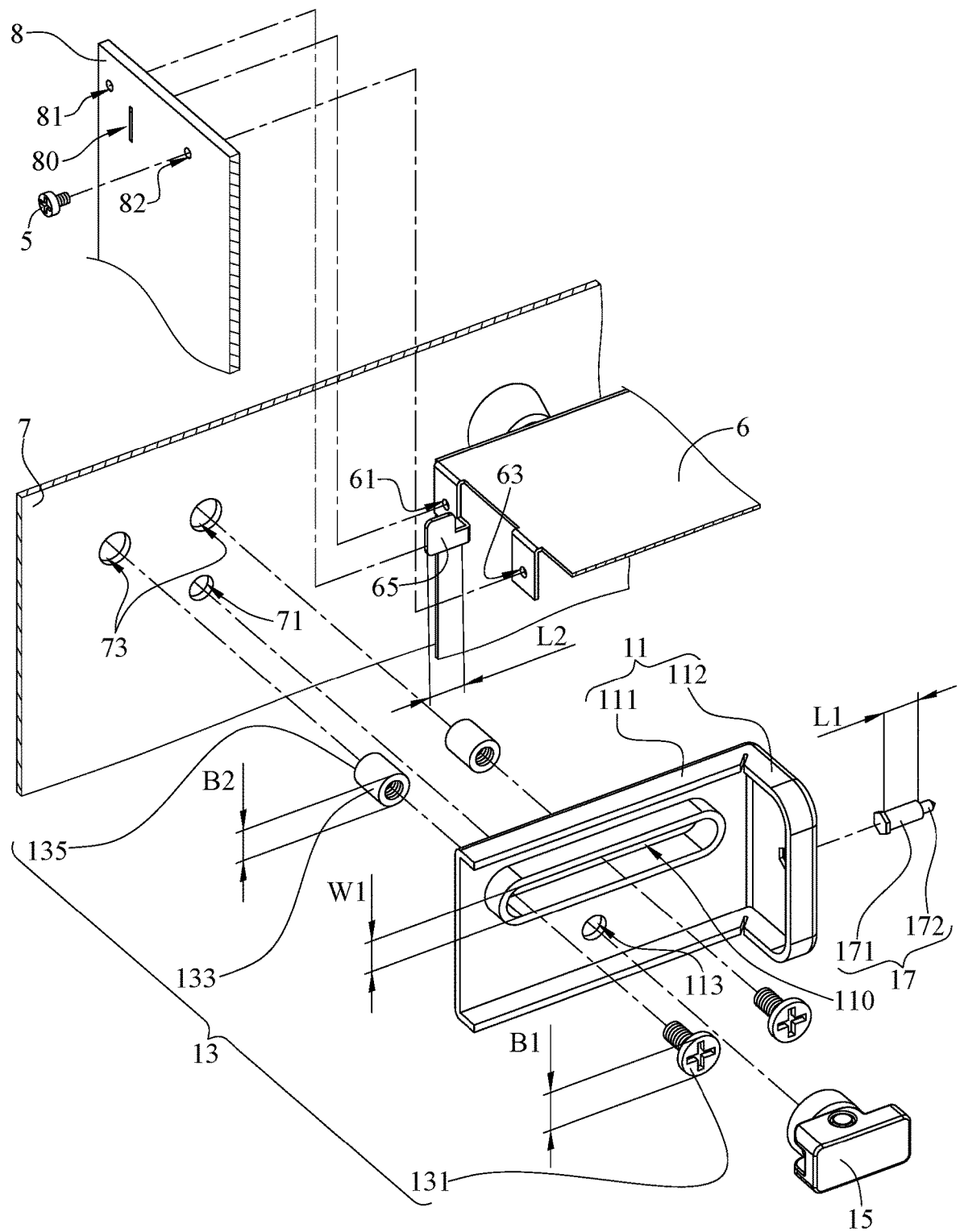
FIG. 2 is a partially enlarged and exploded view of FIG. 1.
Figure 3:
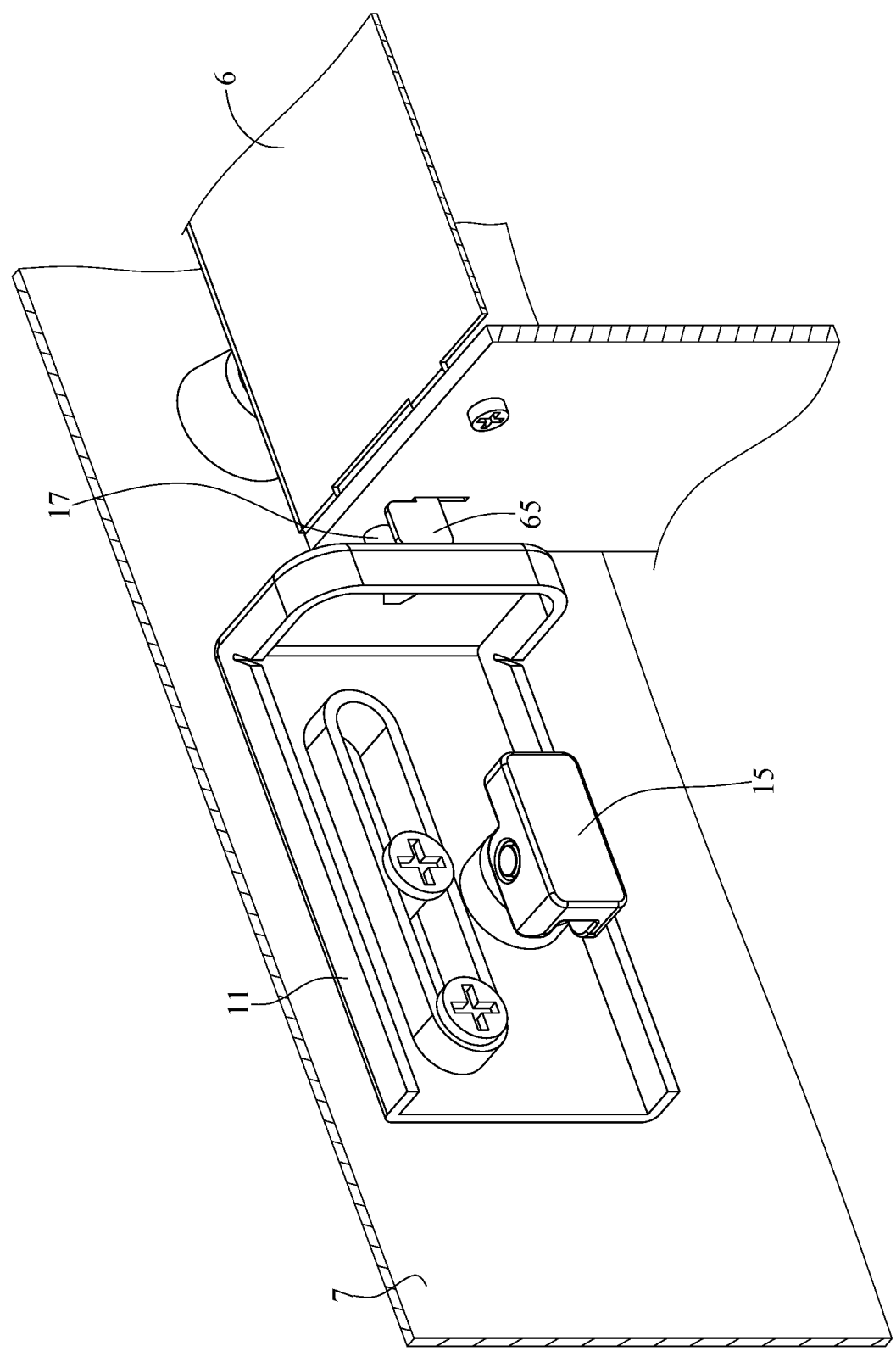
FIG. 3 is a partially enlarged view of FIG. 1.
Figure 4:
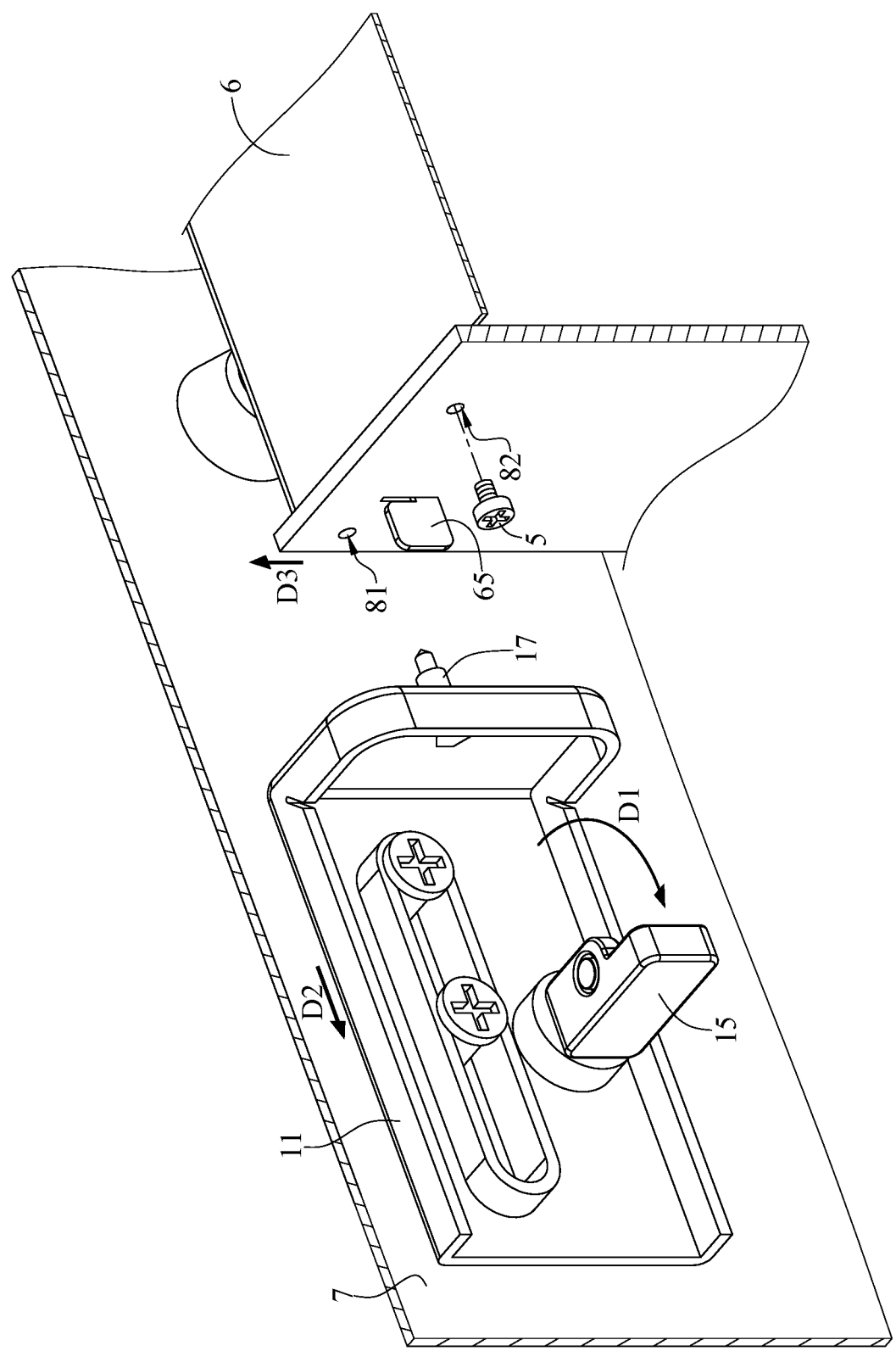
FIG. 4 is a schematic view of a slidable component in FIG. 1 at a releasing position.

Please refer to FIG. 1 to FIG. 4. FIG. 1 is a perspective view of a server chassis and a printed circuit board in accordance with one embodiment of the disclosure, FIG. 2 is a partially enlarged and exploded view of FIG. 1, FIG. 3 is a partially enlarged view of FIG. 1, and FIG. 4 is a schematic view of a slidable component in FIG. 1 at a releasing position.

In this embodiment, a server chassis 9 is provided. The server chassis 9 is configured to detachably fasten a printed circuit board 8. The server chassis 9 includes a case 7, an expansion frame 6 and a fastening assembly 1.

The case 7 has a through hole 71 and two rivet holes 73. The expansion frame 6 is fixed to the case 7, and the expansion frame 6 has an engagement hole 61, a plurality of screw holes 63 and an engagement protrusion 65. In this embodiment, the expansion frame 6 is an expansion hard disk frame, and the printed circuit board 8 is a hard drive backplate, but the present disclosure is not limited thereto. In other embodiments, the expansion frame may be configured for other modules equipped in the server, and the printed circuit board may be a backplate corresponding to said modules.

The fastening assembly 1 includes a slidable component 11, two guiding components 13, a movable pin 15, and a fastening pin 17.

The slidable component 11 has a guiding hole 110 and includes a first part 111 and a second part 112. The second part 112 is connected to one side of the first part 111, and the first part 111 and the second part 112 are non-parallel to each other. In addition, the guiding hole 110 is located at the first part 111, and the guiding hole 110 is, for example, a slotted hole. In this embodiment, the slidable component 11 is a sheet metal, but the present disclosure is not limited thereto. In other embodiments, the slidable component may be made of plastic material.

Each of the guiding components 13 includes a head portion 131, a neck portion 133 and a fixed portion 135. An outer diameter B1 of the head portion 131 is larger than a width W1 of the guiding hole 110, an outer diameter B2 of the neck portion 133 is smaller than the width W1 of the guiding hole 110, and the fixed portion 135 is riveted to the case 7 in the rivet holes 73. As shown in FIG. 3, the neck portion 133 is disposed through the guiding hole 110, such that the slidable component 11 is slidable between a releasing position (as shown in FIG. 4) and a fastening position (as shown in FIG. 3) relative to the guiding components 13.

In this embodiment, the quantity of the guiding components is two, but the present disclosure is not limited to the quantity of the guiding component. In other embodiments, there may be only one guiding component, and the neck portion of the guiding component has an elongated shape extending along a direction parallel to a line of centers of the two rivet holes 73 in FIG. 2 and has a length smaller than a length of the guiding hole so as to guide the slidable component to move in a direction parallel to the line of centers.

In this embodiment, the guiding component 13 is composed of a screw and a screw nut, but the present disclosure is not limited thereto. In other embodiments, a guiding component may be a pin or screw bolt having a head portion and a neck portion with their outer diameter different from each other according to actual design requirements.

Figure 5:
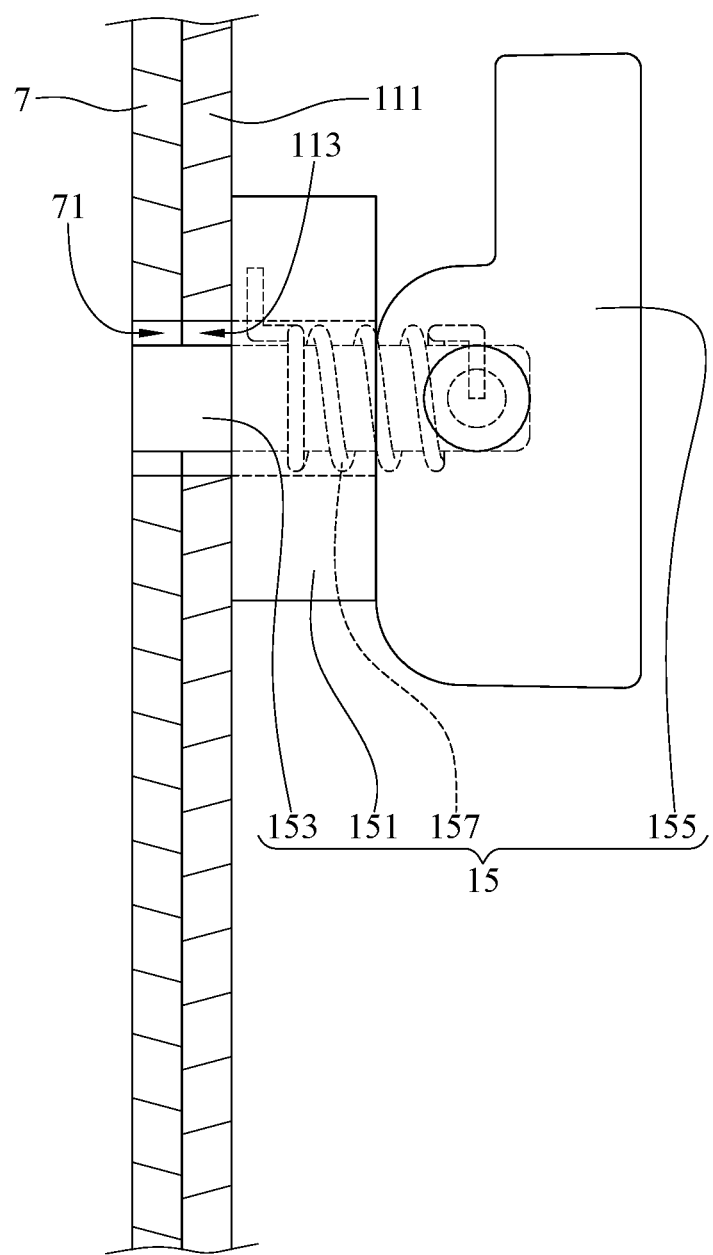
FIG. 5 is a partial top view of a fastening assembly and a case in FIG. 1.
Figure 6:
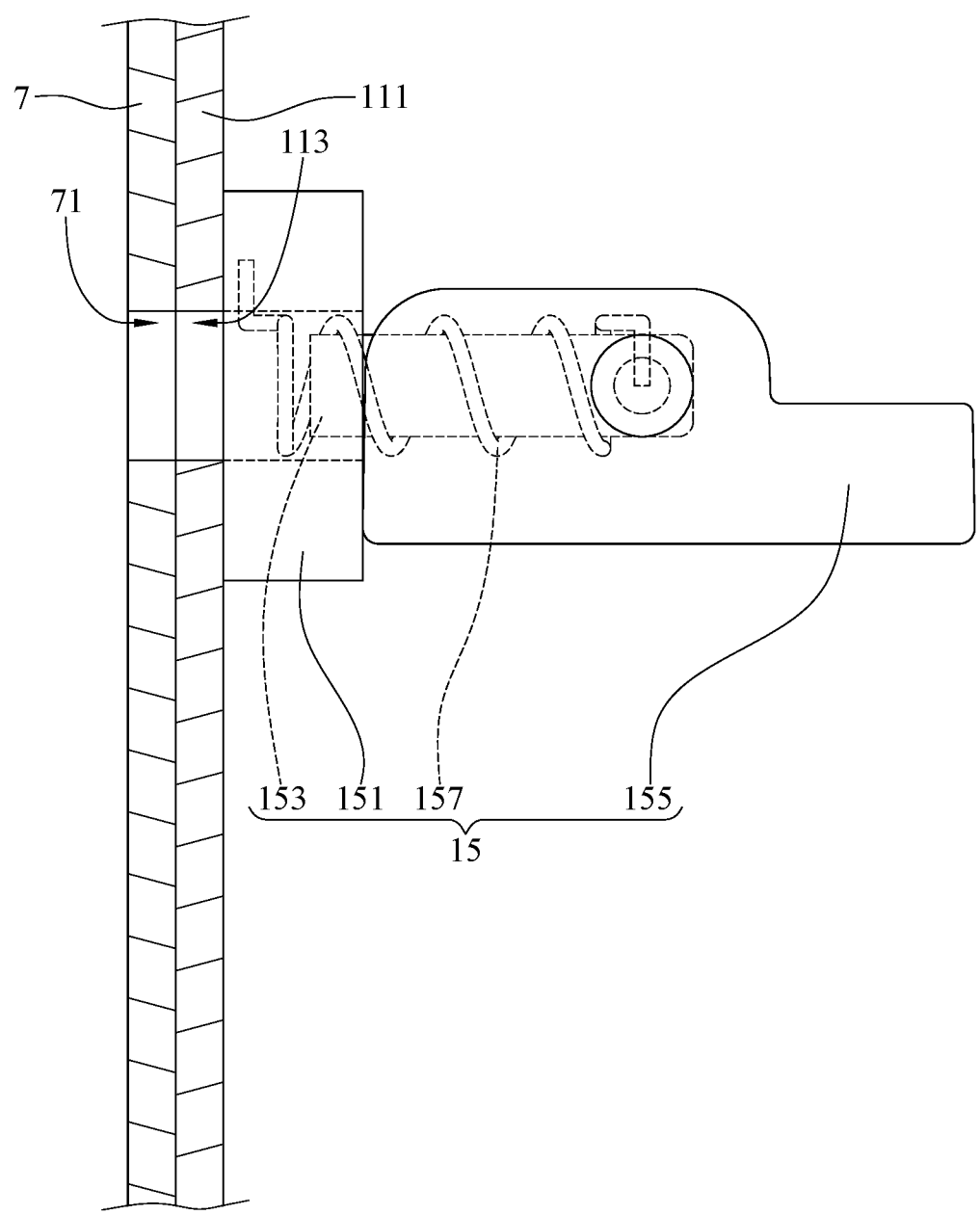
FIG. 6 is a top view showing a handle part in FIG. 1 at a pull-out position.

The movable pin 15 is movably disposed through a through hole 113 of the slidable component 11. Please refer to FIG. 5 and FIG. 6. FIG. 5 is a partial and top view of a fastening assembly and a case in FIG. 1, and FIG. 6 is a top view showing a handle part in FIG. 1 at a pull-out position. The movable pin 15 includes a connection part 151, a pin part 153, a handle part 155, and an extension spring 157. The connection part 151 is fixed to the first part 111 of the slidable component 11. The pin part 153 is movably disposed through the connection part 151, and one end of the pin part 153 is pivotally coupled to the handle part 155. The extension spring 157 is sleeved on the pin part 153, and one end of the extension spring 157 is fixed to the pin part 153 and another end of the extension spring 157 is fixed to the connection part 151. The handle part 155 is pivotable between an engaging position (as shown in FIG. 5) and a pull-out position (as shown in FIG. 6) relative to the connection part 151. The configuration of the movable pin 15 in this embodiment is only exemplary, and the present disclosure is not limited thereto. In other embodiments, the movable pin may be configured with a compression spring to position the pin part thereof according to actual design requirements.

The fastening pin 17 includes a wide part 171 and a narrow part 172 connected to each other. The wide part 171 is fixed to the second part 112 of the slidable component 11, and the narrow part 172 is farther away from the second part 112 than the wide part 171 is to the second part 112. An outer diameter of the wide part 171 is larger than a diameter of a penetrating hole 81 of the printed circuit board 8, and an outer diameter of the narrow part 172 is smaller than the diameter of the penetrating hole 81 of the printed circuit board 8. In addition, a length L1 of the wide part 171 is larger than a protruding length L2 of the engagement protrusion 65 from the printed circuit board 8 so as to prevent the second part 112 of the slidable component 11 from colliding with engagement protrusion 65 when the slidable component 11 is moved towards the printed circuit board 8 so as to make the fastening pin 17 pass through the penetrating hole 81 of the printed circuit board 8 and engagement hole 61 of the expansion frame 6, thereby preventing the engagement protrusion 65 from being damaged.

As shown in FIG. 1 and FIG. 2, the printed circuit board 8 is fixed to the expansion frame 6 by screwing several screws 5 through penetrating holes 82 of the printed circuit board 8 into the screw holes 63 of the expansion frame 6, and inserting the fastening pin 17 of the fastening assembly 1 through the penetrating hole 81, which is closest to the case 7 among the penetrating holes 81 and 82, into the engagement hole 61 of the expansion frame 6. Therefore, users can easily remove the fastening pin 17 from the penetrating hole 81 of the printed circuit board 8 when removing the printed circuit board 8 from the expansion frame 6, which eliminates the inconvenience of unscrewing screws in the corners using screw drivers, eliminates the need of removing the printed circuit board 8 together with the expansion frame 6, and avoids problems of missing screws.

A detailed operation is described below. Referring to FIG. 3 to FIG. 6, when the user wants to remove only the printed circuit board 8 from the server chassis 9 (without removing the expansion frame 6), the user first moves the handle part 155 of the movable pin 15 to pivot from the engaging position (as shown in FIG. 5) to the pull-out position (as shown in FIG. 6) along a direction D1 so as to disengage the pin part 153 from the through hole 71 of the case 7 and make the movable pin 15 located at an extracted position (as shown in FIG. 6). Then, the user moves the slidable component 11 from the fastening position (as shown in FIG. 3) to the releasing position (as shown in FIG. 4) along a direction D2 so as to disengage the fastening pin 17 from the engagement hole 61 of the expansion frame 6 and the penetrating hole 81 of the printed circuit board 8. Then, the user unscrews the screws 5 from the printed circuit board 8, then moves the printed circuit board 8 along a direction D3 until a bottom edge around an engaging hole 80 of the printed circuit board 8 contacts the engagement protrusion 65 of the expansion frame 6, and then moves the printed circuit board 8 along the direction D2 so as to disengage the engaging hole 80 from the engagement protrusion 65. As such, the printed circuit board 8 is removed from the server chassis 9.

On the other hand, when the user wants to install the printed circuit board 8 back into the server chassis 9 after a maintenance or repair operation, the user first moves the printed circuit board 8 along a direction opposite to the direction D2 to make the engagement protrusion 65 of the expansion frame 6 pass through the engaging hole 80, and then moves the printed circuit board 8 along a direction opposite to the direction D3 to engage the engaging hole 80 with the engagement protrusion 65, making the penetrating holes 81 and 82 of the printed circuit board 8 respectively correspond to the engagement hole 61 and the screw holes 63 of the expansion frame 6. Then, the user screws the screws 5 through the penetrating holes 82 of the printed circuit board 8 into the screw holes 63 of the expansion frame 6, moves the slidable component 11 along the direction opposite to the direction D2 from the releasing position (as shown in FIG. 4) to the fastening position (as shown in FIG. 3) so as to insert the fastening pin 17 into the penetrating hole 81 of the printed circuit board 8 and the engagement hole 61 of the expansion frame 6, and then moves the handle part 155 of the movable pin 15 from the pull-out position (as shown in FIG. 6) to the engaging position (as shown in FIG. 5) so as to move the pin part 153 towards the first part 111 of the slidable component 11 to pass through the through hole 71 of the case 7, making the movable pin 15 located at an inserted position (as shown in FIG. 5), and thus the slidable component 11 is positioned at the fastening position.

According to the server chassis and the fastening assembly thereof as described above, the fastening assembly is configured to engage with the penetrating hole of the printed circuit board closest to the case and disposed through the engagement hole of the expansion frame. As such, when the printed circuit board is to be removed from the expansion frame, the fastening pin on the slidable component can be easily removed from the penetrating hole of the printed circuit board and the engagement hole of the expansion frame by moving the slidable component away from the penetrating hole. It eliminates the inconvenience of unscrewing the screws in the corners using screw drivers, eliminates the need of removing the printed circuit board together with the expansion frame, and avoids problems of missing screws.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A server chassis, configured to detachably fasten a printed circuit board, comprising:
    a case, having a through hole;
    an expansion frame, fixed to the case, wherein the expansion frame has an engagement hole; and
    a fastening assembly, comprising:
        a slidable component, having a guiding hole;
        at least one guiding component, disposed through the guiding hole and fixed to the case, such that the slidable component is slidable relative to the at least one guiding component between a releasing position and a fastening position;
        a movable pin, movably disposed through the slidable component, wherein when the slidable component is located at the fastening position, the movable pin is movable between an inserted position and an extracted position; and
        a fastening pin, fixed to the slidable component;
    wherein when the movable pin is located at the inserted position, the movable pin is disposed through the slidable component and the through hole of the case, such that the slidable component is positioned at the fastening position, and the fastening pin passes through a penetrating hole of the printed circuit board and the engagement hole of the expansion frame; when the movable pin is located at the extracted position, the movable pin is disengaged from the through hole of the case, such that the slidable component is able to slide between the releasing position and the fastening position, and the fastening pin is movable along with the slidable component with respect to the expansion frame.

2. The server chassis according to claim 1, wherein a quantity of the at least one guiding component is two, each of the guiding components comprises a head portion, a neck portion and a fixed portion, an outer diameter of the head portion is larger than a width of the guiding hole, an outer diameter of the neck portion is smaller than the width of the guiding hole, and the fixed portion is fixed to the case.

3. The server chassis according to claim 1, wherein the movable pin comprises a connection part, a pin part, a handle part and an extension spring, the connection part is fixed to the slidable component, the pin part is disposed through the connection part, one end of the pin part is pivotally coupled to the handle part, the extension spring is sleeved on the pin part, one end of the extension spring is fixed to the pin part and another end of the extension spring is fixed to the connection part, the handle part is pivotable relative to the connection part between a pull-out position and an engaging position; when the handle part is pivoted from the pull-out position to the engaging position, the pin part is moved towards the slidable component by the handle part and passes through the through hole of the case, and thus the movable pin is located in the inserted position.

4. The server chassis according to claim 1, wherein the slidable component is a sheet metal, the slidable component comprises a first part and a second part, the second part is connected to one side of the first part, the first part and the second part are non-parallel to each other, the guiding hole is located at the first part, and the fastening pin is fixed to the second part.

5. The server chassis according to claim 1, wherein the expansion frame further has an engagement protrusion, the engagement protrusion is configured to be disposed through the printed circuit board, the fastening pin comprises a wide part and a narrow part connected to each other, the wide part is fixed to the slidable component, the narrow part is located farther away from the slidable component than the wide part is to the slidable component, an outer diameter of the wide part is larger than a diameter of the penetrating hole of the printed circuit board, an outer diameter of the narrow part is smaller than the diameter of the penetrating hole of the printed circuit board, and a length of the wide part is larger than a protruding length of the engagement protrusion from the printed circuit board.

6. The server chassis according to claim 1, wherein the expansion frame is an expansion hard disk frame, and the printed circuit board is a hard drive backplate.

7. A fastening assembly, configured to be disposed on a case of a server chassis and configured to detachably fasten a printed circuit board to the case, comprising:
   a slidable component, having a guiding hole;
   at least one guiding component, disposed through the guiding hole and configured to be fixed to the case, such that the slidable component is slidable relative to the at least one guiding component between a releasing position and a fastening position;
   a movable pin, movably disposed through the slidable component, wherein when the slidable component is located at the fastening position, the movable pin is movable between an inserted position and an extracted position; and
   a fastening pin, fixed to the slidable component;
   wherein when the movable pin is located at the inserted position, the movable pin is disposed through the slidable component and configured to be disposed through a through hole of the case, such that the slidable component is positioned at the fastening position, and the fastening pin is configured to be disposed through the printed circuit board and the case; when the movable pin is located at the extracted position, the movable pin is disengaged from the through hole of the case, such that the slidable component is able to slide between the releasing position and the fastening position, and the fastening pin is movable along with the slidable component with respect to the printed circuit board.

8. The fastening assembly according to claim 7, wherein a quantity of the at least one guiding component is two, each of the guiding components comprises a head portion, a neck portion and a fixed portion, an outer diameter of the head portion is larger than a width of the guiding hole, an outer diameter of the neck portion is smaller than the width of the guiding hole, and the fixed portion is configured to be fixed to the case.

9. The fastening assembly according to claim 7, wherein the movable pin comprises a connection part, a pin part, a handle part and an extension spring, the connection part is fixed to the slidable component, the pin part is disposed through the connection part, one end of the pin part is pivotally coupled to the handle part, the extension spring is sleeved on the pin part, one end of the extension spring is fixed to the pin part and another end of the extension spring is fixed to the connection part, the handle part is pivotable relative to the connection part between a pull-out position and an engaging position; when the handle part is pivoted from the pull-out position to the engaging position, the pin part is moved towards the slidable component by the handle part and passes through the through hole of the case, such that the movable pin is located in the inserted position.

10. The fastening assembly according to claim 7, wherein the slidable component is a sheet metal, the slidable component comprises a first part and a second part, the second part is connected to one side of the first part, the first part and the second part are non-parallel to each other, the guiding hole is located at the first part, and the fastening pin is fixed to the second part.

* * * * *